United States Patent
Spady et al.

(10) Patent No.: US 7,032,287 B1
(45) Date of Patent: Apr. 25, 2006

(54) EDGE GRIP CHUCK

(75) Inventors: Blaine R. Spady, Lincoln, NE (US); Christopher W. Blaufus, San Jose, CA (US); Douglas A. Page, San Jose, CA (US); Dan M. Colban, Tracy, CA (US)

(73) Assignee: Nanometrics Incorporated, Milpitas, CA (US)

( * ) Notice: Subject to any disclaimer, the term of this patent is extended or adjusted under 35 U.S.C. 154(b) by 216 days.

(21) Appl. No.: 10/198,948

(22) Filed: Jul. 19, 2002

(51) Int. Cl.
  *B23Q 7/00* (2006.01)
  *B05C 13/00* (2006.01)
  *B05C 13/02* (2006.01)

(52) U.S. Cl. .................. 29/559; 118/500; 118/503; 279/110; 279/123; 269/268; 269/287

(58) Field of Classification Search ............... 29/559, 29/283; 279/110, 123, 121, 119; 269/268, 269/287, 134, 136, 138; 118/500, 503
See application file for complete search history.

(56) References Cited

U.S. PATENT DOCUMENTS

| | | | | |
|---|---|---|---|---|
| 4,817,556 A | * | 4/1989 | Mears et al. | 118/503 |
| 4,932,210 A | * | 6/1990 | Julien et al. | 60/527 |
| 4,971,676 A | * | 11/1990 | Doue et al. | 118/503 |
| 5,040,484 A | * | 8/1991 | Mears et al. | 118/503 |
| 5,192,087 A | * | 3/1993 | Kawashima et al. | 279/71 |
| 5,192,371 A | * | 3/1993 | Shuto et al. | 118/728 |
| 5,352,249 A | * | 10/1994 | Vollaro | 29/25.01 |
| 5,438,419 A | * | 8/1995 | Lee et al. | 356/399 |
| 5,513,594 A | * | 5/1996 | McClanahan et al. | 118/503 |
| 5,688,389 A | * | 11/1997 | Bjornard et al. | 204/298.25 |
| 5,700,297 A | * | 12/1997 | Vollaro | 29/25.01 |
| 5,711,195 A | * | 1/1998 | Koelling | 82/1.11 |
| 5,887,828 A | * | 3/1999 | Appa | 244/215 |
| 5,989,342 A | * | 11/1999 | Ikeda et al. | 118/52 |
| 6,110,121 A | * | 8/2000 | Lenker | 600/463 |
| 6,143,147 A | * | 11/2000 | Jelinek | 204/298.15 |
| 6,179,279 B1 | * | 1/2001 | Asai et al. | 269/164 |
| 6,217,034 B1 | | 4/2001 | Smedt et al. | 279/106 |
| 6,231,038 B1 | * | 5/2001 | Keyser et al. | 269/287 |
| 6,248,222 B1 | * | 6/2001 | Wang | 204/297.09 |
| 6,305,677 B1 | * | 10/2001 | Lenz | 269/13 |
| 6,313,567 B1 | | 11/2001 | Maltabes et al. | 310/328 |
| 6,328,296 B1 | * | 12/2001 | Tyveleijn | 269/297 |
| 6,343,784 B1 | * | 2/2002 | Jourde et al. | 269/287 |
| 6,343,905 B1 | * | 2/2002 | Adams et al. | 414/222.08 |
| 6,363,623 B1 | * | 4/2002 | Abraham | 34/58 |
| 6,371,493 B1 | | 4/2002 | Barbieux | 279/106 |
| 6,427,313 B1 | * | 8/2002 | Ishitani et al. | 29/559 |
| 6,450,725 B1 | * | 9/2002 | Roth et al. | 403/28 |

(Continued)

FOREIGN PATENT DOCUMENTS

EP 448316 A2 * 9/1991

*Primary Examiner*—Essama Omgba
(74) *Attorney, Agent, or Firm*—Silicon Valley Patent Group LLP

(57) ABSTRACT

An actuated edge grip chuck includes tabs with raised portions that press against the side of a substrate as opposed clamping on the top or bottom surfaces. The edge grip chuck includes a solid-state actuator to move a moveable tab into an open position. The solid-state actuator may be, e.g., a piezoelectric actuator or a shape memory alloy. The tab may be biased into the closed position such that when a substrate is held by the edge by the moveable tab and one or more fixed tabs. If desired, more than one moveable tab may be used.

26 Claims, 5 Drawing Sheets

U.S. PATENT DOCUMENTS

| | | | |
|---|---|---|---|
| 6,485,253 B1 | 11/2002 | Adams et al. | 414/806 |
| 6,547,559 B1 * | 4/2003 | Hodos | 432/253 |
| 6,592,526 B1 * | 7/2003 | Lenker | 600/463 |
| 6,610,150 B1 * | 8/2003 | Savage et al. | 118/719 |
| 6,612,014 B1 * | 9/2003 | Donoso et al. | 29/559 |
| 6,652,656 B1 * | 11/2003 | Kopacz et al. | 118/728 |
| 6,672,318 B1 * | 1/2004 | Tsuchiya et al. | 134/147 |
| 6,702,302 B1 * | 3/2004 | Smedt et al. | 279/106 |
| 6,705,217 B1 * | 3/2004 | Godsey et al. | 101/35 |
| 6,761,362 B1 * | 7/2004 | Noguchi | 279/106 |
| 6,779,278 B1 * | 8/2004 | Spady et al. | 33/569 |
| 6,836,690 B1 * | 12/2004 | Spady et al. | 700/108 |
| 2001/0043858 A1 | 11/2001 | Bacchi et al. | 414/757 |
| 2002/0020360 A1 * | 2/2002 | Pocorobba et al. | 118/728 |
| 2002/0041102 A1 | 4/2002 | Krauskopf et al. | 294/1.1 |
| 2002/0048506 A1 | 4/2002 | Babbs et al. | 414/783 |
| 2002/0050244 A1 * | 5/2002 | Engesser | 118/20 |
| 2002/0153676 A1 * | 10/2002 | Noguchi | 279/106 |
| 2004/0020427 A1 * | 2/2004 | Langen | 118/500 |

* cited by examiner

EDGE GRIP CHUCK

FIELD OF THE INVENTION

The present invention relates generally to an apparatus that holds a substrate, such as a semiconductor wafer, and in particular to a chuck that holds substrates by the edge.

BACKGROUND

Devices used to hold substrates, such as semiconductor wafers, flat panel displays, recording head or other similar type of substrates, are commonly referred to as chucks. Chucks are used to hold substrates during processing as well as inspection. Chucks commonly hold a substrate gravitationally, electromagnetically, through the use of a vacuum or by clamping the top and bottom of the substrate at the edge of the substrate.

During inspection of a substrate, the chuck typically is required to move the substrate under the optics of the metrology equipment. It is desirable to move the substrate quickly during inspection to improve throughput. Thus, the substrate should be held securely so that movement of the chuck will not displace the substrate. However, the substrate should be held safely so as to not damage the substrate.

Some substrates, e.g., semiconductor wafers, are very sensitive to environmental conditions. Accordingly, during processing, it is often desirable to inspect a substrate without altering the environmental conditions, e.g., the substrate could be measured within the processing chamber. When inspection of a substrate is to be performed within a chamber at a particular pressure, e.g., in a vacuum, the type of chuck used to secure the substrate is limited. For example, vacuum chucks, as well as pneumatic or vacuum activated clamping chucks, cannot be used in a vacuum environment. Moreover, the space within the chamber is generally limited and, thus, the chuck should have a compact design.

Thus, what is needed is a compact chuck that can safely and securely hold a substrate in various environmental conditions.

SUMMARY

An actuated edge grip chuck, in accordance with an embodiment of the present invention, includes a solid-state actuator to move a moveable tab into an open position. The solid-state actuator may be, e.g., a piezoelectric actuator or a shape memory alloy. The edge grip chuck includes a body and at least one tab coupled to the body, the tab having a raised portion to contact the edge of a substrate. The at least one tab may be integrally formed from the body or may be fixedly coupled to the body. The chuck further includes a moveable tab that is movably coupled to the body. The moveable tab also has a raised portion to contact the edge of a substrate to be held. A solid-state actuator is coupled to the moveable tab and is used to move the moveable tab to hold the substrate. The bottom side of the body may include a recessed portion in which the solid-state actuator is mounted. The chuck includes a means for coupling the solid-state actuator to the moveable tab. For example, a slide may be coupled to the moveable tab, and slidably coupled to a rod that is coupled to the body. The solid-state actuator is then coupled to the slide. If desired, a plurality of moveable tabs may be used. Because a solid-state actuator is used to actuate the moveable tab, the edge grip chuck may be used, advantageously, in a chamber, such as a vacuum chamber.

In accordance with another embodiment of the present invention, a method includes actuating a moveable tab on a chuck into an open position with a solid-state actuator; loading a substrate onto said chuck; and actuating said moveable tab into a closed position to hold said substrate by the edge. The method may include biasing the moveable tab into a closed position.

In another embodiment, the edge grip chuck includes a body that is coupled to a shaft, where the shaft defines an axis of rotation for the body. The edge grip chuck also includes a plurality of tabs coupled to the body. The tabs have a raised portion that contacts the side of a substrate. The area of contact between the raised portion of each tab and the side of the substrate defines a tangent on the side of the substrate that is non-parallel with the top surface of the substrate. At least one of the tabs is moveable. The raised portion of the tabs may be beveled.

DETAILED DESCRIPTION

Figure 1:
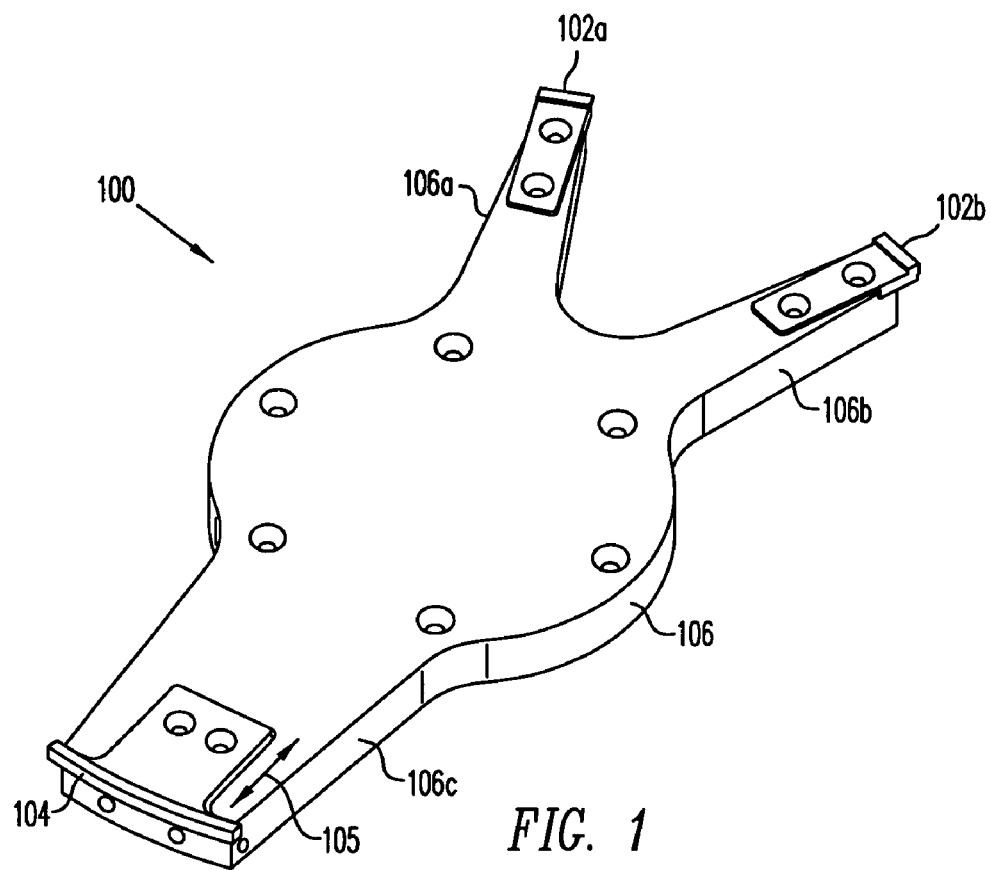
FIGS. 1 and 2 show top perspective and plan views of an actuated edge grip chuck in accordance with the present invention.
Figure 2:
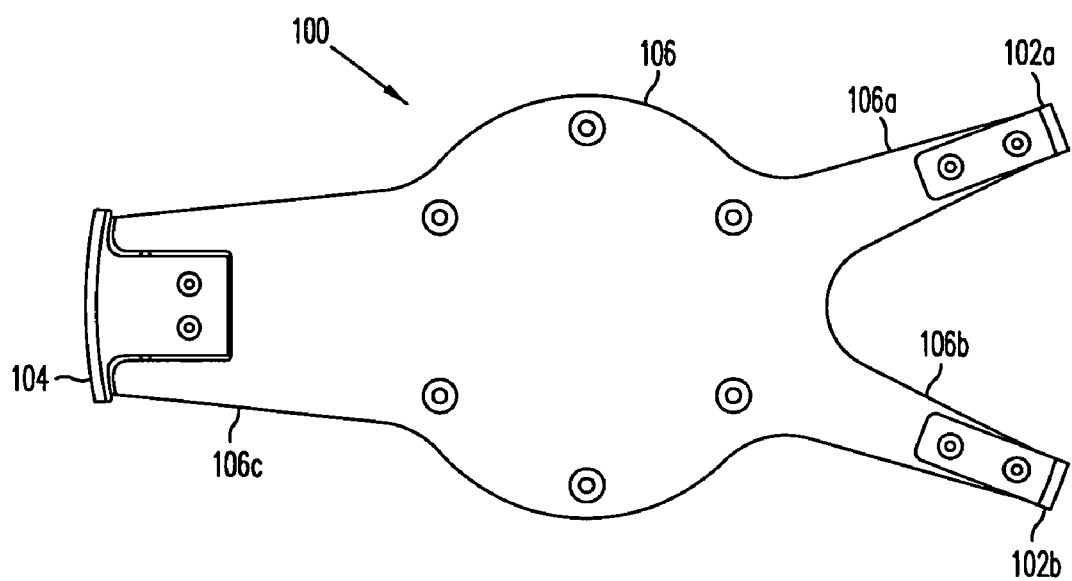

FIGS. 1 and 2 show a perspective view of the top side and a plan view of the top side of an actuated edge grip chuck 100, in accordance with the present invention. Chuck 100 includes a body 106 and a number of tabs 102*a*, 102*b*, and 104 that are used to hold a substrate (not shown in FIGS. 1 and 2). Body 106 is shown as having two small arms 106*a* and 106*b*, and a main arm 106*c*. If desired, body 106 does not need to have arms but instead may have another shape, e.g., circular. Tabs 102*a* and 102*b* are fixed components, i.e., are fixedly mounted to the body 106 of chuck 100, by way of screw, bolts, or other appropriate mechanism. Of course, tabs 102*a* and 102*b* may be integrally formed from body 106. The body 106 may be manufactured from aluminum or other appropriate material. Tabs 102*a*, 102*b*, and 104 of chuck 106 may be manufactured from plastic material known as PEEK (poly-ether-ether-ketone), manufactured by Dupont, Inc., or other similar type material. Tab 104 is moveable mounted to body 106 of the chuck 100 as indicated by arrow 105. As can be seen in FIG. 2, there is a small gap around the edges of tab 104 and body 106, which permits tab 104 to easily move.

Figure 3:
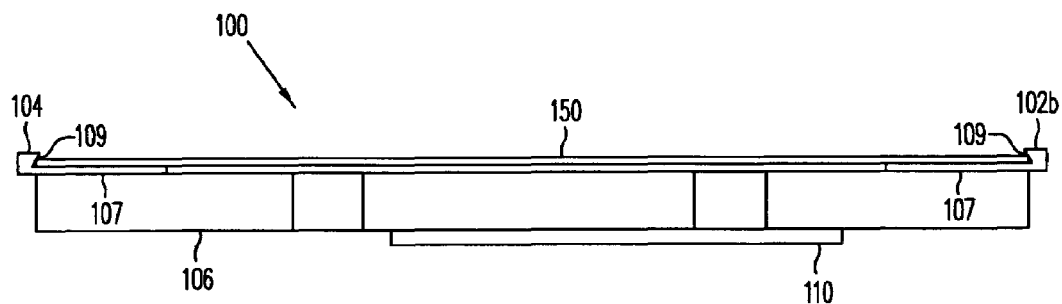
FIG. 3 shows a side view of the chuck.

FIG. 3 shows a side view of chuck 100 holding a substrate 150. As can be seen in FIG. 3, the tabs 102*a*, 102*b*, and 104 (tab 102*a* is not shown in FIG. 3) include a base surface 107 that support substrate 150. The base surfaces 107 of tabs 102*a*, 102*b*, and 104 are raised approximately 0.020 inch above the top surface of the body 106. Tabs 102*a*, 102*b*, and 104 also include raised portions 109 that press against the edge of substrate 150. The raised portion 109 may be beveled to securely hold substrate 150. In another embodiment, the tabs 102a, 102b, and 104 may be flush mounted to body 106 so that the body 106 can support a substrate while the raised portions 109 of tabs 102a, 102b, and 104 securely hold the substrate from the edges.

Figure 4A:
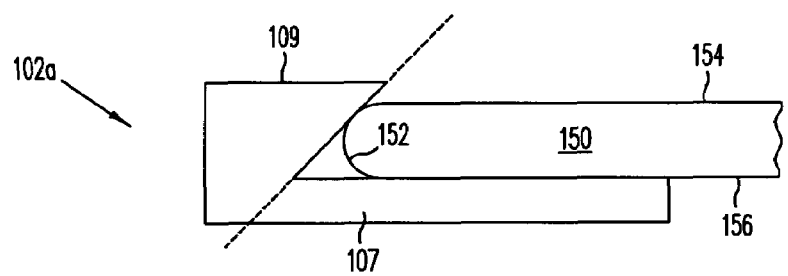
FIGS. 4A and 4B show side views of tabs pressed against the side of a substrate.

FIG. 4A shows a side view of an embodiment of a tab 102a pressed against the substrate 150. As can be seen in FIG. 4A, the raised portion 109 of tab 102a is beveled inward, e.g., at 45 degrees. In other words, the top of the raised portion 109 extends further towards the center of substrate 150 than does the bottom of raised portion 109. The beveled tab 102a presses against the side 152 of substrate 150. Accordingly, tab 102a need not be actuated to clamp on the top surface 154 and bottom surface 156 of substrate 150. Generally, the side 152 of a silicon wafer is curved as illustrated in FIG. 4A, in which case, the raised portion 109 of tab 102a is pressing against the curved side 152. The contact between the raised portion 109 and the side 152 defines a tangent (illustrated by a broken line) that is non-parallel with the top surface 154 of the substrate 150. The shape of all the tabs may be the same. When tab 104 moves to a closed position, tab 104 presses the side of substrate against the other tabs 102a and 102b. The beveling of the raised portion 109 of the tabs provides a small downward force on the substrate against the base surfaces 107 of the tabs. The inward force provided by tab 104 should be adequate to securely hold a substrate.

Figure 4B:
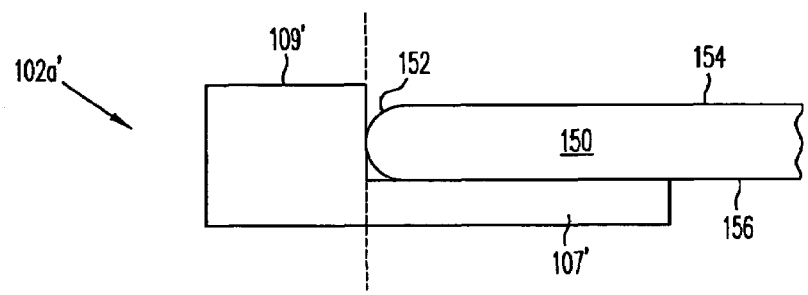

FIG. 4B shows a side view of another embodiment of a tab 102a', pressed against a substrate 150. As can be seen in FIG. 4B, the raised portion 109' of tab 102a' is not beveled. Again, the contact between the raised portion 109' and the side 152 of substrate 150 defines a tangent (illustrated by a broken line) that is non-parallel with the top surface 154 of the substrate 150.

Figure 5:
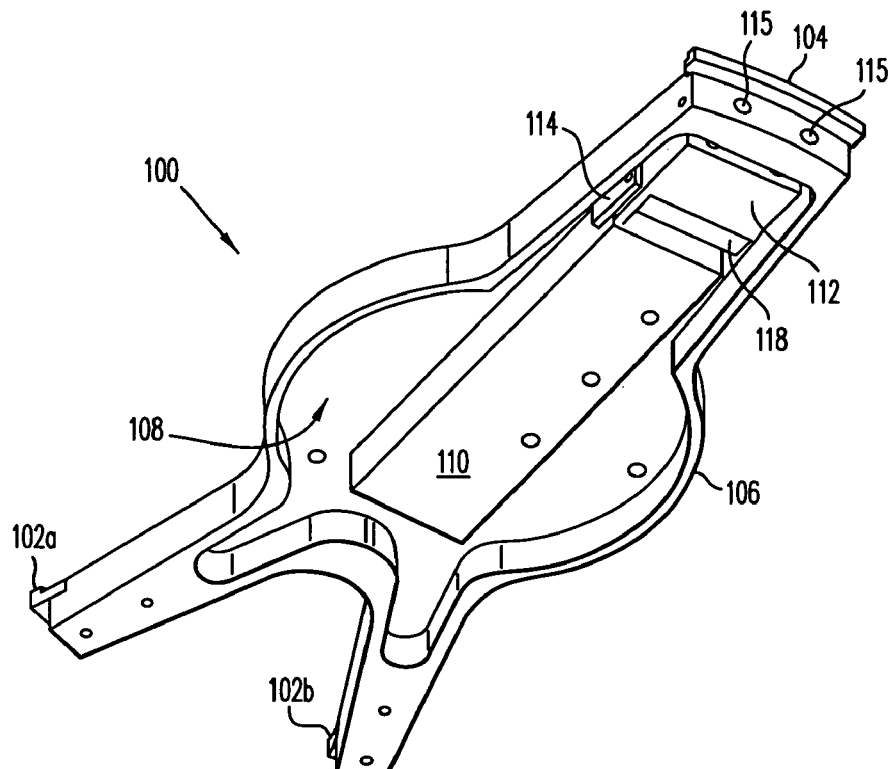
FIG. 5 shows a bottom perspective view the chuck.

FIG. 5 shows a perspective view of the bottom side of chuck 100. As can be seen in FIG. 5, the bottom side of body 106 of chuck 100 includes a recessed center portion 108. Within the recessed center portion 108 is a solid-state actuator 110, such as a piezoelectric actuator. The piezoelectric actuator, e.g., has dimensions of $5/16 \times 1 1/4 \times 3 1/2$ inches, with a push of between 2.5 to 3.5 pounds and a stroke of 2 mm. For example, a piezoelectric actuator manufactured by by Dynamic Structures and Materials LLC, located in Franklin Tenn. as a High Force 2 mm PZT claim may be used as actuator 110. If desired, actuator 110 may be a shape memory alloy, such as part number NM125, manufactured by NanoMuscle, Inc. located in Antioch, Calif. If chuck is to be used within a vacuum environment, the use of a solid-state actuator 110 is particularly advantageous as conventional motors and electric actuators are a source of virtual leakage in a vacuum as well as particle generation.

By placing the actuator 110 within the recessed center portion 108 of body, the chuck 100 remains compact. The recessed center portion 108 also serves to reduce the mass of the chuck 100, while the rigidity of chuck 100 is relatively unaffected.

Figure 6:
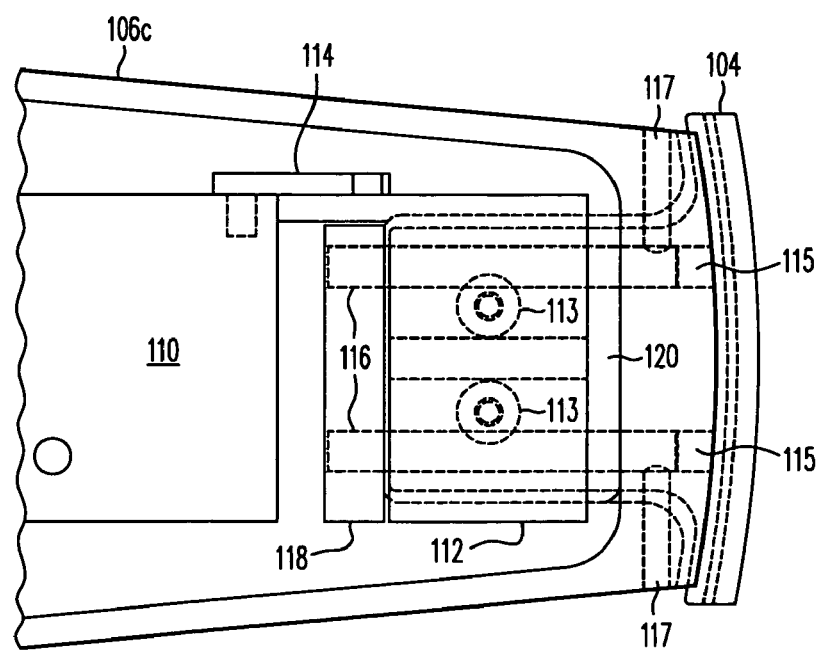
FIG. 6 shows a plan bottom view of a portion of the chuck.

FIG. 6 shows a plan bottom view of a section of main arm 106c. As can be seen in FIGS. 4 and 5, actuator 110 is coupled to a slide 112 by arm 114. Slide 112 is slidably coupled to body 106 and is mounted to tab 104, e.g., by screws 113, bolts, or other appropriate mounting mechanism. Of course, slide 112 and tab 104 may be integrally formed. Rods 116 are mounted to body 106 through holes 115 in body 106 and into a mounting block 118. Screws 117 are used to secure rods 116 in body 106. Rods 116 extend through slide 112 and are used to guide the linear movement of slide 112, and thus tab 104. As can be seen in FIG. 6, an aperture 120 extends through arm 106c for the connection between slide 112 and tab 104 and to allow the free linear movement of the assembly.

In operation, the actuator 110 biases tab 104 into the closed position, e.g., using a spring within actuator 110. To place tab 104 in the open position, an appropriate signal is transmitted to the actuator, which pushes arm 114 and slide 112 thereby pushing tab 104. A substrate may then be loaded onto the chuck and the tab 104 actuated into a closed position, e.g., by the biasing of tab 104. Of course, if desired, the tab 104 may be biased open with actuator 110 actively closing tab 104.

Figure 7:
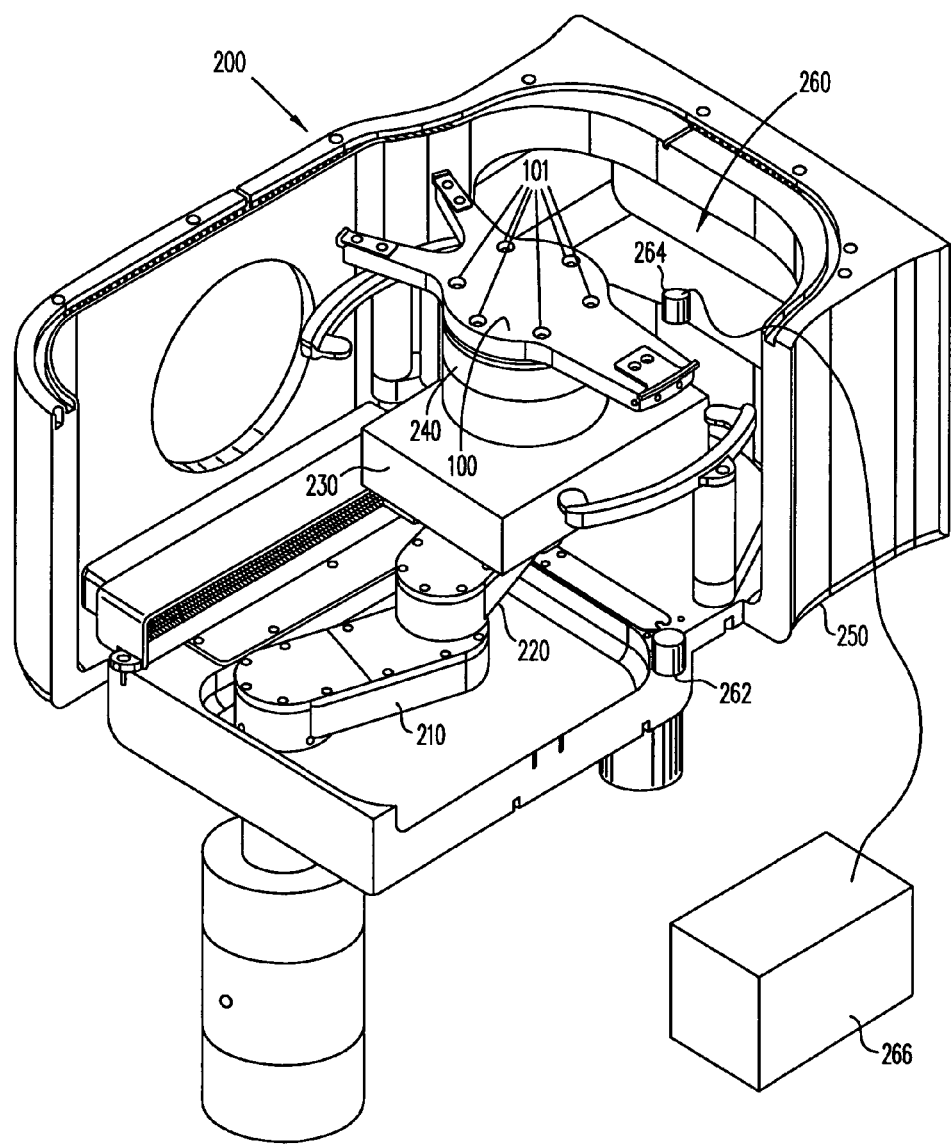
FIG. 7 shows a perspective view of the chuck mounted on a stage in a chamber.

FIG. 7 shows a perspective view of a stage 200 that is positioned within a chamber 250 (the sidewalls and ceiling of chamber 250 are missing in FIG. 7 for clarity). Stage 200 includes a number of arms 210 and 220 that move the chuck 100 in a linear direction and a rotational direction. The stage 200 further includes a Z stage actuator 230 and a theta housing 240 to which chuck 100 is mounted by screws 101. Stage 200 is described in detail in the U.S. patent application entitled "Precision Polar Coordinate Stage", by Christopher W. Blaufus et al., having Ser. No. 10/199,140, filed herewith, which has the same assignee as the present disclosure, and which is incorporated herein by reference.

In addition, as shown in FIG. 7 a prealigner 260 may be used with chuck 100. The prealigner 260 includes an illumination source 262, e.g., a laser, laser diode, or light emitting diode, and a detector 264 that is coupled to a processor 266. The detector 264 is located in the ceiling of the chamber in which the stage located (the ceiling is not shown in FIG. 7) while the source 262 is located in the floor of the chamber. Of course if desired, the positions of the source 262 and detector 264 may be reversed. In use, after the substrate is loaded onto the chuck 202, the chuck 202 rotates the substrate. The prealigner 260 detects the edge and a notch or flat along the edge of the substrate as the substrate rotates and is thus able to calculate the position of the substrate. One type of prealigner that may be used is described in more detail in U.S. patent application entitled "High Precision Substrate Prealigner", by Blaine R. Spady et al., having Ser. No. 10/199,278, filed herewith, which has the same assignee as the present disclosure, and which is incorporated herein by reference.

Figure 8:
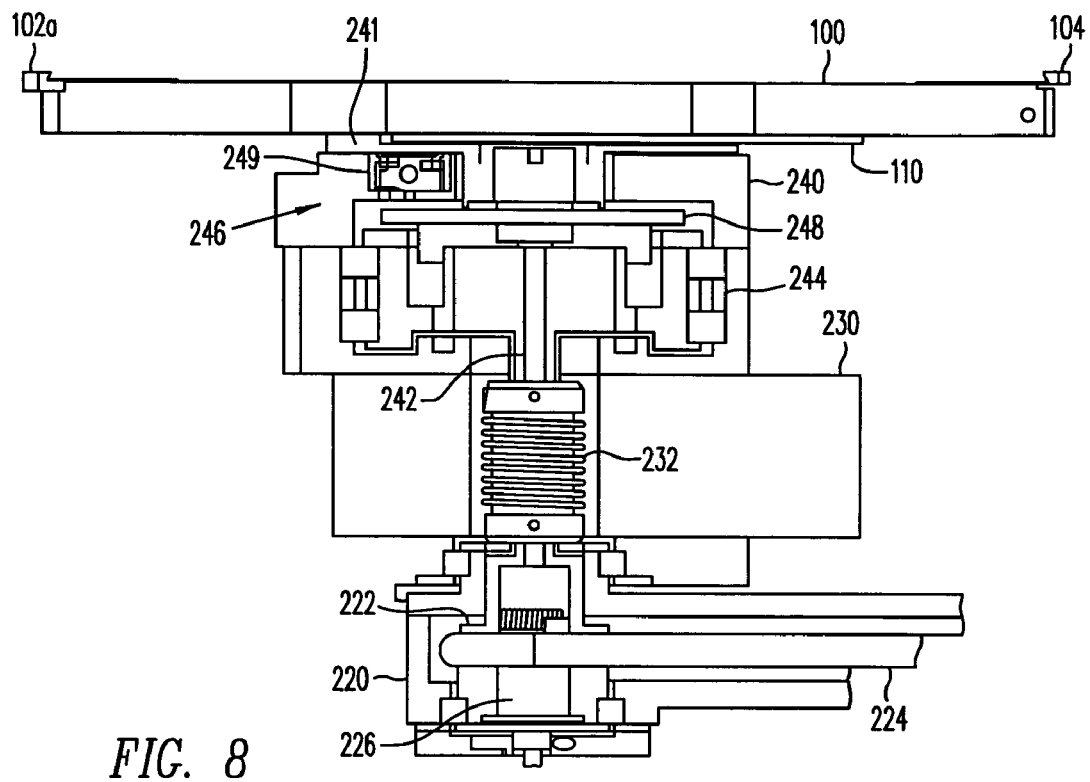
FIG. 8 shows a side view of chuck mounted on a theta housing.

FIG. 8 shows a side view of chuck 100 mounted on stage 200 (only a portion of stage 200 is shown in FIG. 8). Chuck 100 is coupled to a mounting block 241 for theta housing 240. Within the theta housing 240, a shaft 242 that is connected to mounting block 241 to provide rotation to chuck 100 is supported by a bearing 244. The shaft 242 defines the axis of rotation for the chuck 100. In addition, the theta housing 240 includes a radial encoder 246; including a scale 248 coupled to shaft 242 and a sensor head 249. The radial encoder 246 is used to precisely monitor the location/rotation of chuck 100. The rotary encoder 246 may be electrically coupled to a motor that controls the rotational motion of chuck 100 and may provide location feedback as part of a servo motion control system capable of very precise rotation of chuck 302. The rotary encoder may be manufactured by MicroE Systems as part number M3100V.

As shown in FIG. 8, the theta housing 240 is mounted on top of the Z stage actuator 230. The Z stage actuator 230 may be, e.g., a piezoelectric flexure type actuator or other appropriate type actuator, such as, e.g., a 1 mm Z stage manufactured by Dynamic Structures and Materials, located in Franklin, Tenn. The Z stage actuator 230 includes a flexible coupling 232 to permit extension of shaft 242. The flexible coupling is manufactured by, e.g., Servometer located in Cedar Groves, N.J., as part number FC-12.

The shaft 242 extends through the Z stage actuator 230 and into the end of the arm 220. A pulley 222 coupled to a belt 224 provides rotational motion to the shaft 242.

Because chuck 100 rotates relative to stage 200, the wires that connect to the actuator 110 include a rotator contact 226. The rotary contact 226 may be located, e.g., within the end of the second arm 220 or other appropriate location. The rotary contact, e.g., may be a slip ring such as that manufactured by Air Flyte Electronics, Co. in Bayonne N.J., as part no. CA4-604-6.

Figure 9:
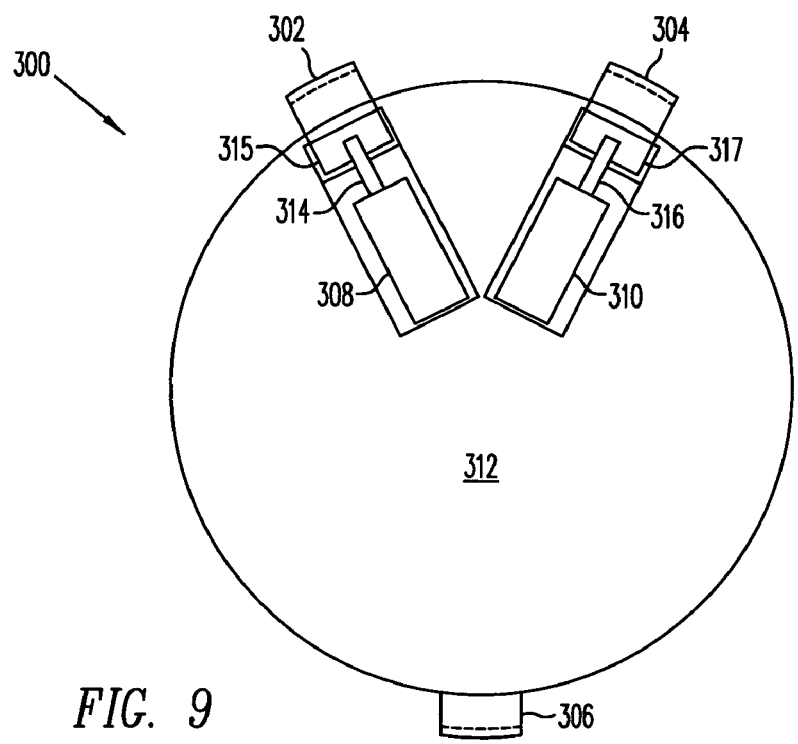
FIG. 9 shows a bottom plan view of another embodiment of an actuated edge grip chuck.

It should be understood that while chuck 100 is shown having one moveable tab 104, other embodiments of the present invention may include additional moveable tabs. Moreover, chuck 100 may use more or fewer fixed tabs. FIG. 9, for example, shows a bottom plan view of another embodiment of an actuated edge grip chuck 300. Chuck 300 includes two moveable tabs 302 and 304 and a single fixed tab 306. Each moveable tab 302 and 304 is coupled to an actuator 308 and 310, respectively, which are located within a recessed portion of the chuck 300 body 312. As shown in FIG. 9, the tabs 302 and 304 are coupled to the actuators 308 and 310 by arms 314 and 316 through apertures 315 and 317.

While the present invention has been described in connection with specific embodiments, one of ordinary skill in the art will recognize that various substitutions, modifications and combinations of the embodiments may be made after having reviewed the present disclosure. The specific embodiments described above are illustrative only. Various adaptations and modifications may be made without departing from the scope of the invention. Thus, the spirit and scope of the appended claims should not be limited to the foregoing description.

What is claimed is:

1. An edge grip chuck comprising:
   a body;
   at least one tab coupled to said body, said tab having a raised portion to contact the edge of a substrate, the tab having a horizontally extending base coupled to the raised portion, the base having a top surface to contact the bottom surface of the substrate;
   a moveable tab movably coupled to said body, said moveable tab having a raised portion to contact the edge of said substrate, the movable tab having a horizontally extending base coupled to the raised portion, the base having a top surface to contact the bottom surface of the substrate;
   wherein the top surface of the base of the tab and the top surface of the base of the movable tab are positioned above the body such that the substrate does not contact the body; and
   a solid-state actuator coupled to said moveable tab, said solid-state actuator moving said moveable tab to hold said substrate.

2. The edge grip chuck of claim 1, wherein said at least one tab includes two tabs fixedly coupled to said body.

3. The edge grip chuck of claim 1, wherein said solid-state actuator is a piezoelectric actuator.

4. The edge grip chuck of claim 1, wherein said solid-state actuator is a shape memory alloy.

5. The edge grip chuck of claim 1, wherein said moveable tab is biased closed to hold said substrate.

6. The edge grip chuck of claim 1, further comprising a means for coupling said solid-state actuator to said moveable tab.

7. The edge grip chuck of claim 6, wherein said means for coupling said solid-state actuator to said moveable tab comprises:
   at least one rod coupled to said body; and
   a slider slidably mounted on said at least one rod, said slider being coupled to said moveable tab and wherein said solid-state actuator is coupled to said slider.

8. The edge grip chuck of claim 7, wherein said slider and said moveable tab are integrally formed.

9. The edge grip chuck of claim 1, further comprising a plurality of moveable tabs moveably coupled to said body, each of said plurality of moveable tabs having a raised portion to contact the edge of said substrate.

10. The edge grip chuck of claim 9, further comprising a plurality of solid-state actuators, each of said plurality of moveable tabs being coupled to a respective solid-state actuator.

11. The edge grip chuck of claim 1, wherein said at least one tab is formed from poly-ether-ether-ketone.

12. The edge grip chuck of claim 1, wherein the bottom side of said body has a recessed portion, said solid-state actuator is coupled to said body within said recessed portion of said body.

13. An apparatus comprising:
   a chamber;
   a stage mounted inside said chamber, said stage having a chuck for holding a substrate, said chuck comprising:
      a body;
      a moveable tab movably coupled to said body, said moveable tab having a raised portion to contact the edge of said substrate, the moveable tab having a horizontally extending base coupled to the raised portion, the base having a top surface to contact the bottom surface of the substrate, wherein the top surface of the base of the moveable tab is positioned above a top surface of the body; and
      a solid-state actuator coupled to said moveable tab, said solid-state actuator moving said moveable tab to hold said substrate.

14. The apparatus of claim 13, wherein said chamber is a vacuum chamber.

15. The apparatus of claim 13, wherein said solid-state actuator is one of a piezoelectric actuator and a shape memory alloy.

16. The apparatus of claim 13, wherein said chuck further comprises a fixed tab having a raised portion to contact the edge of said substrate.

17. The edge grip chuck of claim 13, wherein the bottom side of said body has a recessed portion, said solid-state actuator is coupled to said body within said recessed portion of said body.

18. A method comprising:
   actuating a moveable tab on a chuck into an open position with a solid-state actuator;
   loading a substrate onto said chuck by placing the substrate on the top surface of a horizontally extending base of the moveable tab, the horizontally extending base of the moveable tab being positioned above the top surface of the chuck; and
   actuating said moveable tab into a closed position to hold said substrate by the edge, wherein the bottom surface of the substrate does not physically contact the top surface of the chuck.

19. The method of claim 18, further comprising biasing said moveable tab into a closed position.

20. An edge grip chuck for holding a substrate having a top surface, a bottom surface and a side, said edge grip chuck comprising:
- a rotatable body coupled to a shaft, said rotatable body configured to rotate about an axis of rotation defined by said shaft; and
- a plurality of tabs mounted to said body, said tabs having a raised portion to contact the side of a substrate, wherein the area of contact between the raised portion of each tab and said side of said substrate defines a tangent on said side of said substrate that is non-parallel with the top surface of said substrate, wherein each tab has a horizontally extending base coupled to the raised portion, the base having a top surface to contact the bottom surface of the substrate;
- wherein at least one of said tabs is a moveable tab movably mounted to said body.

21. The edge grip chuck of claim 20, further comprising a solid-state actuator coupled to said moveable tab, said solid-state actuator moving said moveable tab to hold said substrate.

22. The edge grip chuck of claim 20, wherein said raised portion of each tab is beveled.

23. The edge grip chuck of claim 20, wherein at least one of said tabs is fixedly coupled to said body.

24. The edge grip chuck of claim 20, wherein each of said tabs has a base surface that supports the bottom surface of said substrate.

25. The edge grip chuck of claim 24, wherein said body has a top surface, said base surface of each tab is above the top of said body.

26. The edge grip chuck of claim 24, wherein said tabs are poly-ether-ether-ketone.

\* \* \* \* \*